US010551417B2

(12) United States Patent
Novak et al.

(10) Patent No.: US 10,551,417 B2
(45) Date of Patent: Feb. 4, 2020

(54) INDUCTOR CURRENT MEASUREMENT PROBE

(71) Applicant: Oracle International Corporation, Redwood Shores, CA (US)

(72) Inventors: Istvan Novak, Bedford, MA (US); Peter J. Pupalaikis, Ramsey, NJ (US); Lawrence W. Jacobs, Redwood Shores, CA (US)

(73) Assignee: Oracle International Corporation, Redwood Shores, CA (US)

( * ) Notice: Subject to any disclaimer, the term of this patent is extended or adjusted under 35 U.S.C. 154(b) by 193 days.

(21) Appl. No.: 15/803,309

(22) Filed: Nov. 3, 2017

(65) Prior Publication Data

US 2018/0143264 A1 May 24, 2018

Related U.S. Application Data

(60) Provisional application No. 62/452,828, filed on Jan. 31, 2017, provisional application No. 62/425,366, filed on Nov. 22, 2016.

(51) Int. Cl.
| | |
|---|---|
| *G01R 27/26* | (2006.01) |
| *H02M 3/06* | (2006.01) |
| *G01R 19/25* | (2006.01) |
| *G01R 31/08* | (2006.01) |
| *G01R 19/00* | (2006.01) |

(Continued)

(52) U.S. Cl.
CPC ......... *G01R 19/2513* (2013.01); *G01R 13/20* (2013.01); *G01R 19/0092* (2013.01);
(Continued)

(58) Field of Classification Search
CPC .. G01R 31/40; G01R 31/086; G01R 19/0092; G01R 19/2509; G01R 19/2513;
(Continued)

(56) References Cited

U.S. PATENT DOCUMENTS

| | | | |
|---|---|---|---|
| 5,311,116 A | 5/1994 | Rogers | |
| 8,289,037 B2 * | 10/2012 | Labib | G01R 19/0092 323/277 |

(Continued)

OTHER PUBLICATIONS

Steve Sandler, Heidi Barnes, "Introduction to Power Integrity," DesignCon 2016, Jan. 19-21, 2016, Santa Clara, CA.

(Continued)

*Primary Examiner* — Minh N Tang
(74) *Attorney, Agent, or Firm* — Invoke

(57) ABSTRACT

An inductor current measurement probe apparatus and system are described herein. In an embodiment, a system comprises a probe interconnect including a first connector that couples to a positive terminal of the inductor and a second connector that couples to a negative terminal of the inductor. The system further comprises an RC filter that is coupled to the probe interconnect and that includes at least one resistor and at least one capacitor in an arrangement that converts a voltage of the inductor to a differential capacitor voltage. The system further comprises a differential active probe input circuitry including a positive terminal and a negative terminal that are coupled to the RC filter and arranged to convert the differential capacitor voltage to a single-ended capacitor voltage. In other embodiments, the RC filter may be coupled directly to the inductor. The system may further convert the capacitor voltage to inductor current.

20 Claims, 11 Drawing Sheets

(51) Int. Cl.
*G01R 13/20* (2006.01)
*G01R 31/40* (2014.01)

(52) U.S. Cl.
CPC ....... *G01R 19/2509* (2013.01); *G01R 31/086* (2013.01); *G01R 31/40* (2013.01)

(58) Field of Classification Search
CPC ........ G01R 13/20; G01R 27/14; G01R 27/26; G01R 27/2676; H02M 3/06; H02M 3/156; H02M 3/158
See application file for complete search history.

(56) References Cited

U.S. PATENT DOCUMENTS

| | | | |
|---|---|---|---|
| 8,854,026 B2* | 10/2014 | Karlsson | G01R 27/2605 323/283 |
| 2007/0274015 A1* | 11/2007 | Isham | H02H 7/1227 361/93.1 |
| 2009/0146643 A1* | 6/2009 | Ostrom | H02M 3/156 324/123 R |
| 2009/0222234 A1 | 9/2009 | Dmitriev-Zdorov | |
| 2010/0213897 A1 | 8/2010 | Tse | |
| 2012/0139518 A1* | 6/2012 | Cleveland | H02M 3/157 323/283 |
| 2012/0194161 A1* | 8/2012 | Latham, II | H02M 3/156 323/286 |
| 2013/0147452 A1 | 6/2013 | Yang et al. | |
| 2016/0111958 A1 | 4/2016 | Choi et al. | |

OTHER PUBLICATIONS

Radhakrishnan, et al, "Optimization of Package Power Delivery and Power Removal Solutions to meet Platform level Challenges," Intel Developer Forum, 2004.

* cited by examiner

INDUCTOR CURRENT MEASUREMENT PROBE

BENEFIT CLAIMS; RELATED APPLICATIONS; INCORPORATION BY REFERENCE

This application claims the benefit of U.S. Provisional Patent Appl. Ser. No. 62/452,828, filed Jan. 31, 2017, titled "INDUCTOR CURRENT MEASUREMENT PROBE", and U.S. Provisional Patent Appl. Ser. No. 62/425,366, filed Nov. 22, 2016, titled "TEST TOOL FOR POWER DISTRIBUTION NETWORKS", and, the entire contents for each of which are hereby incorporated by reference.

This application is related to U.S. patent application Ser. No. 15/215,280, now U.S. Pat. No. 10,126,374, filed Jul. 20, 2016, titled "UNIVERSAL POWER DISTRIBUTION TEST TOOL AND METHODOLOGY", and U.S. patent application Ser. No. 15/721,151, filed Sep. 29, 2017, titled "TEST TOOL FOR POWER DISTRIBUTION NETWORKS", the contents of which are hereby incorporated by reference.

TECHNICAL FIELD

The present disclosure relates, generally, to the measurement of current through an inductor and, more specifically, to inductor current measurements in switch-mode power supplies (SMPS) for power integrity (PI) measurements in the design and validation of SMPS.

BACKGROUND

In electronics, it is often useful to measure and sense currents and voltages present in a circuit. Voltage measurements are made by connecting a positive and negative lead of the input of a differential amplifier to two locations in a circuit. When the negative lead is ground or reference ground, it is assumed to have a voltage of zero. In this case, the voltage measured is called a single-ended measurement of the voltage at the positive lead. When the negative lead is one side and the positive lead is another, the voltage measured is the difference between the voltage at the positive side and negative side. This voltage measurement is called a differential voltage measurement.

Generally current measurements are more difficult than voltage measurements. One approach is to insert a known, generally small resistance in series with the current and measure the voltage drop across the resistance. Another approach is to measure the integrated magnetic field around the conductor. The former approach involves modification of the circuit and causes losses. The latter approach also may involve modification of the circuit in some manner to expose a path to loop around the conductor. Sometimes, there are other ways to infer current from a particular voltage measurement.

In test and measurement applications, there is often a need to probe currents and voltages. Probing may involve measuring currents and voltages, often for design, analysis, validation, and/or debugging of various electronic circuits. Voltage probes for test and measurement are most common, and single-ended voltage probes are the most common type of voltage probe. Differential voltage probes are more difficult and often need to deal not only with measuring differential voltages, but with rejecting unwanted common-mode voltages. Current probes are usually available in traditional forms for low frequency applications and include a wire or conductor carrying the current capable of looping the probes around. The wire or conductor of the probe is often included as part of a design constraint requirement an element of the probe to surround the current carrying conductor. This constraint may be difficult to work around when probing existing circuits.

In test and measurement situations, needs arise involving probing of voltages and currents in switch-mode power supplies (SMPS). The design and analysis of power delivery systems such as SMPS fall under a broad category called power integrity (PI). These SMPS are critical to most of today's electronic circuits and often require extensive analysis of output impedance, stability, and other behavior and parameters.

FIG. 2 depicts a basic schematic diagram of a SMPS. The SMPS comprises voltage regulation module (VRM) 4, which controls output voltage 12 under changing load currents through load impedance 13 and changing input voltage 8. In many applications, VRM 4 may regulate output voltage 12 by modulating switch node voltage 11. For example, VRM 4 may change the duty cycle of two switches: high-side field-effect transistor (FET) 5 that connects one side of inductor 7 to input voltage 8 and low-side FET 6 that connects the same side of inductor 7 to a low voltage (usually ground). The other side of inductor 7 connects to output voltage 12 that remains essentially constant, delivering output current 15 to load impedance 13 reference to a device under test (DUT) reference ground 16. A feedback network 14 feeds back measurements of output voltage 12 and/or sometimes measurements of output current 15.

In many high-current, high-power applications, it is common for multiple phases to supply current to the output. In multi-phase systems, the current is supplied through multiple inductors that are independently switched in a coordinated effort by a VRM. In the design, analysis, validation and debugging of multi-phase systems, it is often necessary to measure the current sharing between the multiple phases. In these applications in particular, it is useful to measure the currents through the multiple inductors, particularly under transient output load currents. Unfortunately, there is usually no opportunity to break the circuit for connection of a traditional current measurement probe.

Current can be calculated directly from the voltage drop across an inductor with an internal parasitic resistance, but the dynamic range required to make accurate measurements is beyond the capabilities of most measurement instruments. To address this, a method was determined for inductor current measurement and published as Linfinity, "A simple current-sense technique eliminating a sense resistor.", AN-7, July 1998, which provides a method used by SMPS and VRM designers to sense inductor current particularly for over-current detection and crowbar circuitry to shut down the system in the event of various fault conditions. In this application note, the authors point out the need for matching the time-constant formed by the inductor and internal parasitic resistance and an RC network formed by shunting the inductor with a series resistor-capacitor combination. In the intended use of this application, precise matching is not required because precise equalization of the low-frequency current measurement and higher frequency switching current is not necessary as it is used primarily for fault current detection. Furthermore, in the intended application, the RC network would be designed into the circuit and would not need to be added later. Using this application note, some engineers utilizing SMPS in their systems, hand-solder RC networks into their systems to make these measurements in test and measurement applications. The use of the methods put forth in this application note requires careful handling of the circuit and calculation of matching values. Without precise matching of circuit element values, this application note is not well suited for test and measurement applications and needs additional improvement.

In U.S. Pat. No. 8,289,037, filed Sep. 30, 2009, titled "Method and Apparatus to Measure Current in Power Switchers" to Labib et al., various methods for inductor current measurements and their drawbacks are surveyed, preferring the method provided in Linfinity AN-7 with the addition of methods of providing for determination of the inductor parasitic resistance through calibration circuitry. This inductor parasitic resistance sets the low-frequency portion gain of the system in converting the measured voltage to inductor current, but does not enable calibration of high-frequency portion or the general frequency response of the measurement system. Labib et al. is silent regarding calibration of the full frequency response, and as it provides no mechanism or method for adjusting the RC network resistor and/or the RC network capacitor, nor any method for processing the acquired differential voltage, it is inadequate for complete, precise, and accurate inductor current measurement.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

The embodiments are illustrated by way of example and not by way of limitation in the figures of the accompanying drawings. It should be noted that references to "an" or "one" embodiment in this disclosure are not necessarily to the same embodiment, and they mean at least one. In the drawings.

DETAILED DESCRIPTION

Figure 1:
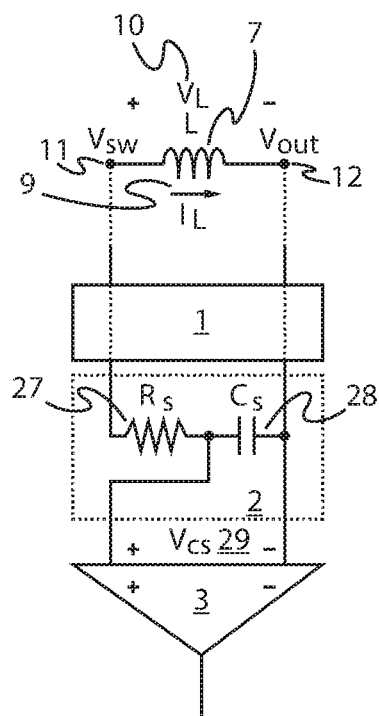
FIG. 1 is a block diagram of an inductor current measurement probe, according to an embodiment.
Figure 2:
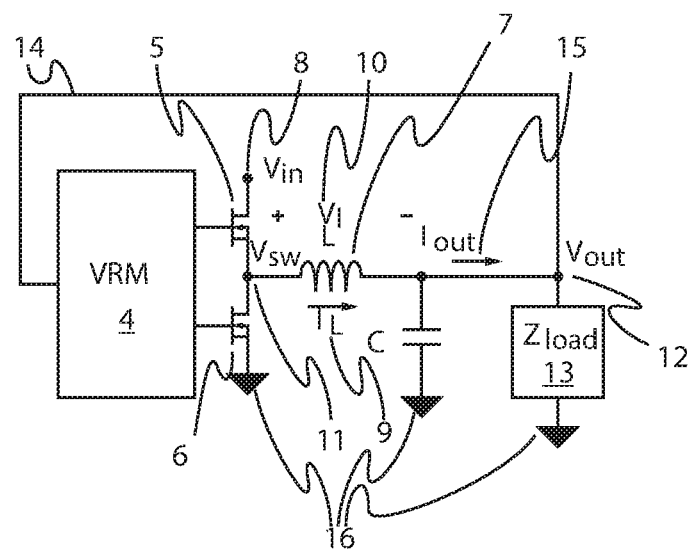
FIG. 2 is a simplified schematic of a buck converter, according to an embodiment.

In the following description, for the purposes of explanation, numerous specific details are set forth in order to provide a thorough understanding. One or more embodiments may be practiced without these specific details. Features described in one embodiment may be combined with features described in a different embodiment. In some examples, well-known structures and devices are described with reference to a block diagram form in order to avoid unnecessarily obscuring the present invention.

1. GENERAL OVERVIEW
2. PROBE ARCHITECTURE
3. SYSTEM CALIBRATION
4. SIGNAL PROCESSING HARDWARE
5. MISCELLANEOUS; EXTENSIONS

1. General Overview

An inductor current measurement probe is provided comprising probe interconnect, RC filter, and differential active probe input circuitry portions. The probe interconnect connects between the switch node voltage and output voltage voltages at an inductor.

The RC filter comprises an RC network resistor and an RC network capacitor in an arrangement that enables the inductor voltage to be converted to a differential capacitor voltage for processing within a test and measurement instrument.

By measuring and/or supplying values of the inductance and the inductor parasitic resistance in the inductor and measuring, selecting, adjusting and/or calibrating values of the RC network resistor and a RC network capacitor, the probe and an accompanying processing system can compensate for the zero frequency (DC) system gain $1/R_L$ and the residual mismatch in time-constants $L/R_L$ and $R_s \cdot C_s$.

The probe and processing system has many advantages in that it allows for precise, accurate and cost-effective measurement of inductor current.

In an embodiment, the probe is constructed with a combined probe interconnect and RC filter portion, which may be very small and inexpensive, and fitted to a differential active probe input circuitry portion formed from an existing differential voltage probe used for precise and accurate differential voltage measurements in test and measurement applications. Furthermore, the analog processing of the inductor voltage being probed may be augmented with digital processing such as can be performed within a digital storage oscilloscope (DSO).

The techniques described herein accordingly comprise the several steps and the relation of one or more of such steps with respect to each of the others, and the apparatus embodying features of construction, combinations of elements and arrangement of parts that are adapted to affect such steps, all is exemplified in the following detailed disclosure, and the scope of the invention will be indicated in the claims.

2. Probe Architecture

An analysis and explanation follows for an inductor current probe utilized in measuring inductor current in a buck converter with the understanding that with minor variation well understood by those skilled in the art that the analysis is easily adapted to other converter topologies not limited to boost, and buck-boost and fly-back converter topologies.

Also, while there are many opportunities for nonlinearities in the analysis of switch-mode power supplies (SMPS), the analysis provided is a linear analysis with the understanding that the analysis is approximate to the extent of linearity of the system. Assumption of sufficient linearity of systems is common in electrical engineering.

Furthermore, while the analysis provided is linear, other non-linear inductor models and their usage is anticipated, such as, and not limited to equivalent series resistance (ESR) that changes with frequency due to skin-effect, for example or for more complicated linear and non-linear models.

FIG. 1 illustrates an example inductor current measurement probe. The probe comprises three portions, including:
1. probe interconnect 1 portion;
2. RC filter 2 portion; and
3. differential active probe input circuitry 3 portion.

Probe interconnect 1 comprises the probe portion that provides the means for connecting across inductor 7 at switch node voltage 11 and output voltage 12 voltage nodes. Various aspects of probe interconnect 1 may affect the probe performance.

One aspect is the loop created by the wires consisting of inductor 7, probe interconnect 1 wires, RC network resistor 27, and RC network capacitor 28. A reason why this may affect performance is because of the strong magnetic field surrounding inductor 7 capable of inducing current in the loop, leading to measurement errors. A way of reducing this loop is for probe interconnect 1 to comprise twisted-pair wiring whereby each wire is wound around the other causing tight coupling between the wires, reduced loop area, and lower sensitivity to electromagnetic interference (EMI).

Another aspect of probe interconnect 1 is electric field susceptibility, especially due to the potentially high switch node voltage 11. Differential mode electric field susceptibility is improved by twisting the wires as it causes each wire to experience nearly the same electric field intensity, thus causing at least a differential mode voltage to be nearly zero. Electric field susceptibility may be improved by shielding probe interconnect 1. This may involve an additional connection of the shield to a ground or reference ground within the SMPS or may be unconnected to the SMPS and connected to a ground or reference ground of the probe.

It is understood that while twisted pair wiring may reduce the area of the loop, it is sometimes advantageous to utilize wires that are parallel to each other, either closely coupled or widely spaced in order to minimize skew between the wires in probe interconnect 1.

In probe interconnect 1, twisted-pair, coax, shielded twisted-pair, twinax, twin-lead, bifilar and other wiring methods may be used.

To improve immunity to the magnetic fields that might be present in the device under test (DUT), one might employ ferrite beads arranged along probe interconnect 1 or at the connection to inductor 7, or employ electromagnetic field absorbing materials or even ferrite filled foam.

At inductor 7, many connection possibilities may be used including preferably soldering, but also connection clips, probe pins and pogo pins and other methods.

While not shown in FIG. 1, in an embodiment, probe interconnect 1 is connected not only to inductor 7, but also to the aforementioned ground or reference ground of the SMPS and/or additionally other signals in the system of interest including input voltage 8. Furthermore, because each side of inductor 7 includes switch node voltage 11 and output voltage 12, signals of particular interest in power integrity (PI) measurements with the latter used for measurements of output impedance. For example, it may be preferable and useful to provide means within the probe for connection of the voltages at these measurement points directly to a test and measurement instrument like the instrument connected to the probe.

Figure 3:
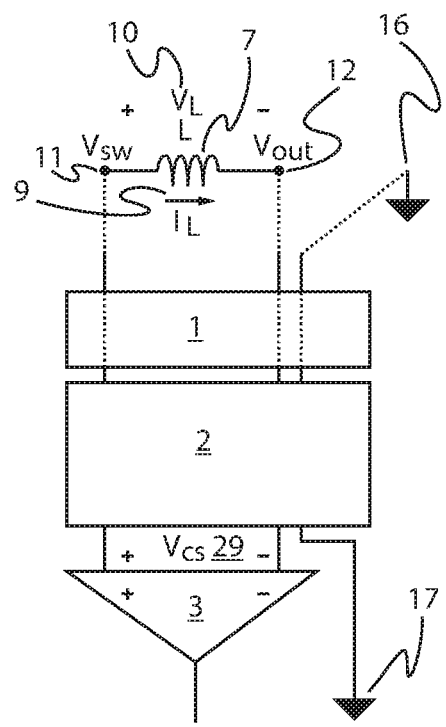
FIG. 3 is a possible grounding arrangement for an inductor current measurement probe, according to an embodiment.

A possible grounding arrangement is provided in FIG. 3, where the connection of DUT reference ground 16 to measurement reference ground 17 is shown through probe interconnect 1. Measurement reference ground 17 is preferably the ground supplied to differential active probe input circuitry 3 and may be connected to the measurement instrument receiving the voltage measured by differential active probe input circuitry 3 or isolated. If the DUT has no direct connection to earth ground, then it is preferable to connect the measurement reference ground to the DUT reference ground. Also, DUT reference ground 16 is generally connected somewhere in RC filter 2 in an arrangement that minimizes noise and pickup by the probe. Grounding arrangements are well known to those skilled in the art and therefore these grounding arrangements are generally omitted from the other figures so as not to clutter them with the understanding that grounding arrangements are generally made as indicated in FIG. 3.

RC filter 2 comprises an RC network and potentially other components for providing differential capacitor voltage 29.

Differential active probe input circuitry 3 converts differential capacitor voltage 29 into a single-ended voltage that can be applied to a measurement instrument. Alternatively, differential active probe input circuitry 3 may not be part of the probe, but instead part of an instrument that receives the signal.

All three of these elements may be present in various forms at various locations mechanically and may even be optionally omitted.

Probe interconnect 1 and RC filter 2 may be mechanically co-located with differential active probe input circuitry 3 existing inside of an instrument or omitted.

Probe interconnect 1 and RC filter 2 may be manufactured together for connection to an existing differential probe, such as a Teledyne LeCroy AP033 probe, through a connection to the existing differential probe head.

Probe interconnect 1 and RC filter 2 might be reversed in connection order where RC filter 2 is connected directly to inductor 7 and probe interconnect 1 connects the signal to differential active probe input circuitry 3 or measurement instrument.

Portions of RC filter 2 might be at different ends of probe interconnect 1 with some components closer to inductor 7 or other components closer to differential active probe input circuitry 3 or measurement instrument.

Differential active probe input circuitry 3 portion itself might be directly connected to RC filter 2 in a probing tip for connection to another portion in an existing differential probe head. Furthermore, differential active probe input circuitry 3 portion might contain additional gain, such as ten times, to enhance its usefulness with the relatively small signals involved in these measurements and to allow compatibility with a larger range of existing differential probes that may not supply gain internally.

In one embodiment, as shown in FIG. 1, RC filter 2 comprises RC network resistor 27 whose one side connects through probe interconnect 1 to switch node voltage 11 and whose other side connects to RC network capacitor 28 and to the positive terminal of differential active probe input circuitry 3. RC filter 2 further comprises RC network capacitor 28 whose one side connects to RC network resistor 27 and to the plus terminal of differential active probe input circuitry 3 and whose other side connects to the negative terminal of differential active probe input circuitry 3.

In RC filter 2 in FIG. 1, one side of differential capacitor voltage 29 measurement made by differential active probe input circuitry 3 is at the voltage determined by output voltage 12. This is determined by the connection of one side of RC network capacitor 28 to output voltage 12. This arrangement is preferable, especially in a buck converter topology, because output voltage 12 may be at a lower voltage than switch node voltage 11 thereby reducing the common-mode voltage requirements of differential active probe input circuitry 3. In other embodiments, the arrangement may be reversed with one side of differential capacitor voltage 29 connected to switch node voltage 11 instead of output voltage 12. With downstream processing, this swapping between switch node voltage 11 and output voltage 12 may be achieved by swapping the probe connection points and applying a negative gain to resulting inductor current 9 calculation without altering the probe construction.

Additionally or alternatively, RC network resistor 27 may be split between each side of RC network capacitor 28.

Figure 4:
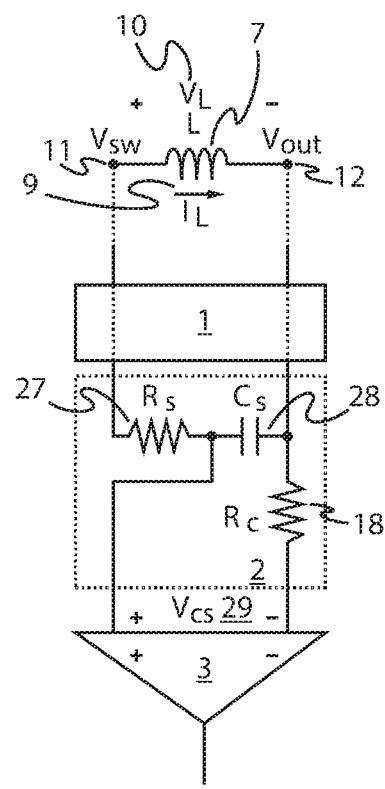
FIG. 4 is a block diagram of an inductor current measurement probe with a compensation resistor, according to an embodiment.

In another embodiment, as shown in FIG. 4, additional compensation resistor 18 is added to RC filter 2 between one side of RC network capacitor 28 and the negative terminal of differential active probe input circuitry 3. This arrangement may reduce the DC offset error produced by differential active probe input circuitry 3. Preferably, the value of compensation resistor 18 is the same as RC network resistor 27, but other values can also be used.

Figure 6:
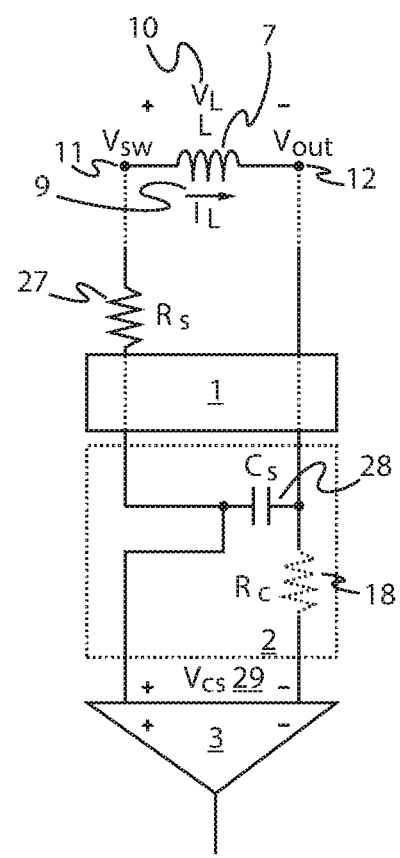
FIG. 6 is a block diagram of an inductor current measurement probe with an optional compensation resistor and the RC network resistor at the probe tip, according to an embodiment.

FIG. 6 illustrates an alternative arrangement whereby RC network resistor 27 has one side connected directly to switch node voltage 11 and the other side connecting through probe interconnect 1 to RC filter 2. Optional compensation resistor 18 is also shown, as previously discussed. While not shown, RC network capacitor 28 may also be placed at the connection point of inductor 7, and RC network resistor 27 may be placed after probe interconnect 1 in RC filter 2.

Figure 5:
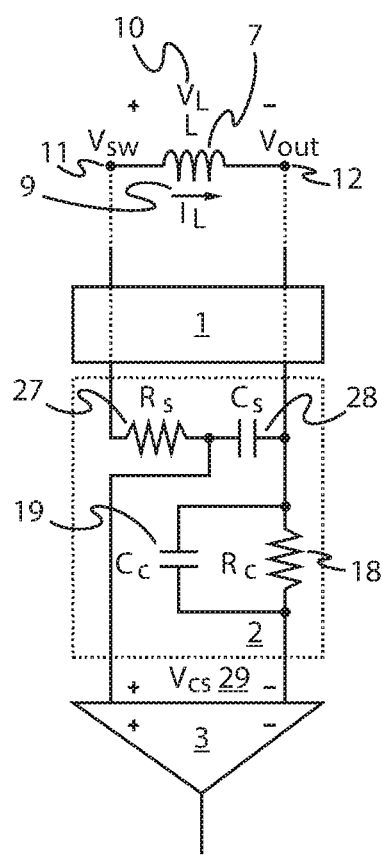
FIG. 5 is a block diagram of an inductor current measurement probe with a compensation resistor and additional compensation elements, according to an embodiment.

To improve noise, further arrangements are provided in FIG. 5, which illustrates an example arrangement where compensation capacitor 19 is added across compensation resistor 18. The value of compensation capacitor 19, denoted $C_c$ is preferably chosen in conjunction with the values of compensation resistor 18, denoted $R_c$, RC network capacitor 28, denoted $C_s$ and RC network resistor 27, denoted $R_s$ such that:

$$R_c \cdot C_c = R_s \cdot C_s \quad (1)$$

Otherwise, any mismatch between the products $R_c \cdot C_c$ and $R_s \cdot C_s$ may be dealt with through further processing of the measurement waveforms.

Although the components shown in RC filter 2 are shown as simple lumped elements, it should be understood that these elements may be manually adjustable components such as trimmable resistors, capacitors, potentiometers, etc. as well as components whose values are electronically variable such as varactor diodes, etc. through means not shown in the figures.

Figure 7:
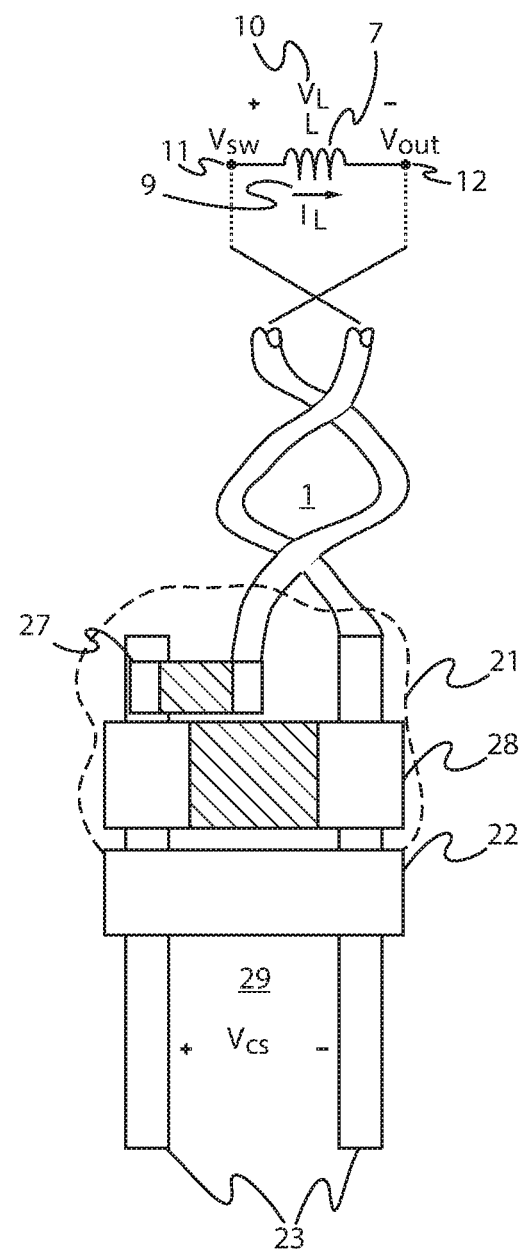
FIG. 7 shows a construction of a probe RC filter, according to an embodiment.

FIG. 7 illustrates one possible construction for connecting RC filter 2 through probe interconnect 1 to inductor 7 or to the head of an existing differential probe such as the Teledyne APO33. This particular probe, like many differential probes, presents a female connector with receptacles spaced with 100 mil spacing capable of receiving a square pin available in the form of header 22 holding a variable number of 25 mil diameter square pin 23.

Here, RC network resistor 27 and RC network capacitor 28 are connected as in FIG. 1 with the understanding that other connection possibilities considered are possible. In FIG. 7, RC network capacitor 28, which is a larger component, straddles each square pin 23 and is soldered directly to each one. RC network resistor 27 sits on top, with one side soldered to RC network capacitor 28 and square pin 23 with the other side connected directly to probe interconnect 1. It is advantageous to use some form of epoxy or potting compound to provide for encapsulation 21. This technique encapsulates the components, electrically isolates them, and provides strain relief for probe interconnect 1.

Figure 8:
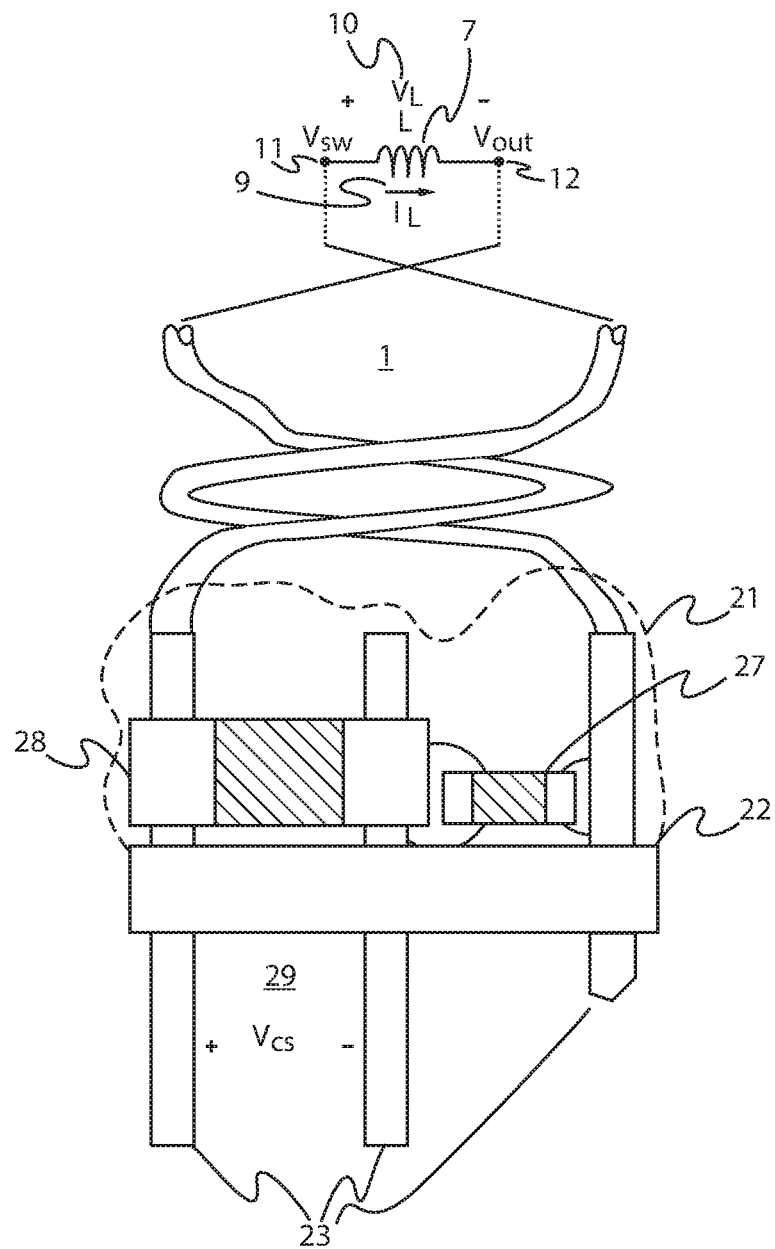
FIG. 8 shows a construction of a probe RC filter, according to an embodiment.
Figure 9:
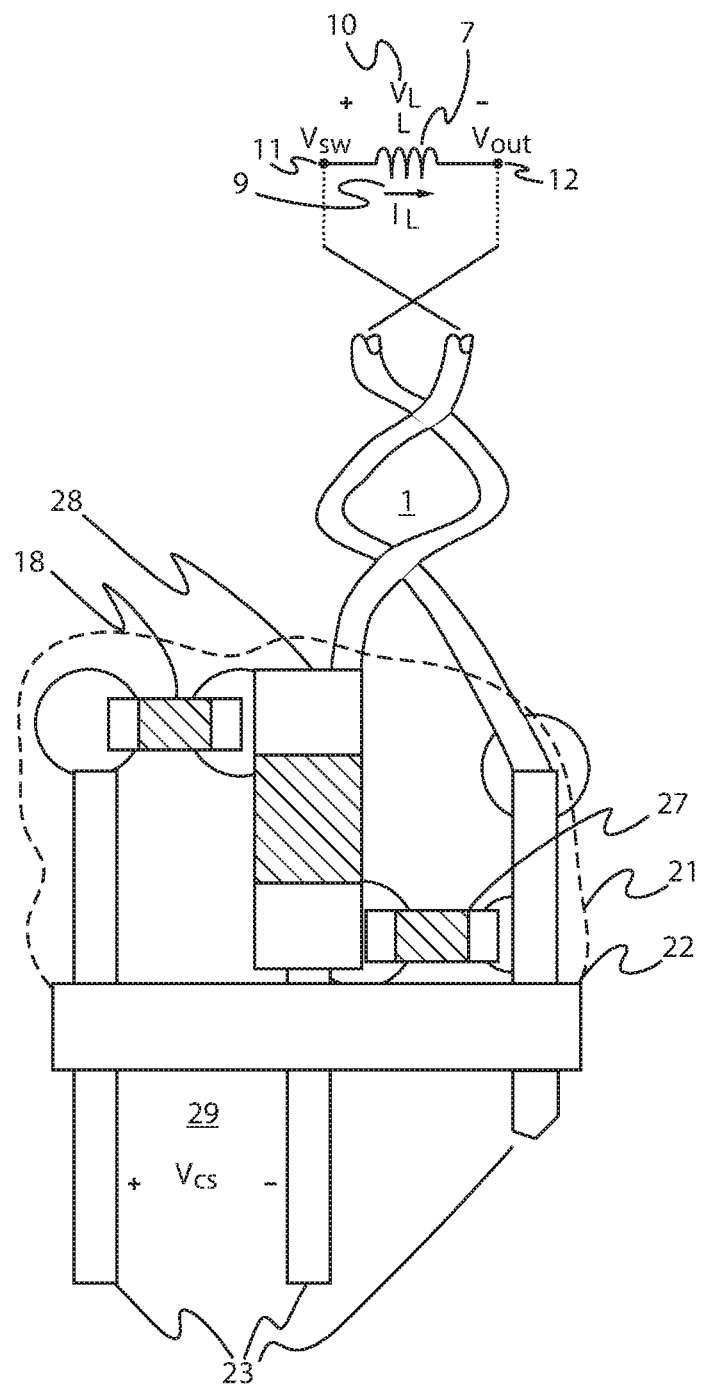
FIG. 9 shows a construction of a probe RC filter with a compensation resistor, according to an embodiment.

FIG. 8 illustrates an alternate construction possibility for connecting RC filter 2. This construction involves RC network resistor 27 straddling a pair of square pins 23. One side of the construction is formed by connecting one of the pair of square pins 23 to RC network capacitor 28. The other side is formed by clipping the other pin of the pair of square pins 23 on to the connection side of differential active probe input circuitry 3, which connects to probe interconnect 1. This construction has the advantage of a stronger connection between each square pin and probe interconnect 1.

It should be noted that many manufacturers of passive components offer custom components for particular applications and the use of customer passive components such as three or four terminal or other numbers of terminals RC combinations may be advantageous and has been anticipated. This could allow single components comprising one or more of RC network resistor 27, RC network capacitor 28, compensation resistor 18 or other circuit elements. The switching frequency per phase may vary between approximately $F_{sw\,min}$=200 kHz and $F_{sw\,max}$=2 MHz and the time constants generally exceed the switching period by between $\tau_{min}$=100 to $\tau_{max}$=500 times. Therefore, the $L \cdot R_L$ time constant tends to be bounded as follows:

$$\frac{\tau_{min}}{F_{sw\,max}} \leq \frac{L}{R_L} \leq \frac{\tau_{max}}{F_{sw\,min}} \quad (2)$$

With current components, Eq. (2) is approximately:

$$50\ \mu s \leq \frac{L}{R_L} \leq 2.5\ ms$$

This is less than two decades of difference, and less than six octaves of difference. Knowing that mismatch between $L/R_L$ and $R_s \cdot C_s$ time constants determines the difference between zero frequency (DC) and high-frequency gain, this means that one could solve the problem in a multitude of ways.

One way is to provide RC filter 2 with either RC network resistor 27 or RC network capacitor 28 with two 1.7 decades of adjust range, or multiple probes with less than 1.7 decades of adjust range to cover the total range of interest.

Another way is to provide multiple probes with ranges of RC time constant in octave multiplicative increments to cover the range meaning that the DC and high-frequency gain will vary by at most ±3 dB. In other words, as an example, if it were determined that RC filter 2 has a fixed 50 nF RC network capacitor 28, then RC network resistor 27 values of 1, 2, 4, 8, 10, 20, 40, 80 kΩ would serve the purpose and would involve further processing whereby no more than a maximum of ±3 dB gain were involved.

There are many ways to break this issue down based on this discussion, and octave spacing of $R_s \cdot C_s$ time constant is just one example. The final resulting mismatch may be dealt with through subsequent processing as described further below.

3. System Calibration

For test and measurement applications where high accuracy is desired, it may be desirable to calibrate the system. This calibration can provide for trimming or adjustment of RC network resistor 27 or RC network capacitor 28 values, either manually or electronically, or for use in subsequent processing.

The system may be calibrated in a variety of way, depending on the implementation. One way is through the use of a calibrated current load, where test and measurement instruments exist for this purpose. Otherwise, DC calibration can be made by inducing known inductor currents 9 and/or by applying known load impedances 13 to the system. As stated previously, the DC gain is $1/R_L$.

More comprehensive calibration is generally optimal over simple DC gain calibration. There are a few ways to perform this calibration. One is to induce known very high-frequency inductor current 9 and compare the high-frequency gain to the DC noting that the difference in high- and low-frequency gain is the difference between the $L/R_L$ and $R_s \cdot C_s$ time constants.

It may be difficult to induce a completely known, high-frequency inductor current. As $R_L$ is obtained from a DC gain calibration and L might be well known or determined from a time-constant measurement which shall be provided for in the subsequent discussion, the $L/R_L$ and $R_s \cdot C_s$ time constants can be matched by comparing the envelope of the saw-tooth switching current waveform to that expected from the value of L. This matching may be done because generally the switching frequency is well above the filter knees provided in Eqs. (17) and (18). Therefore all of the Fourier components of the saw-tooth switching waveform are amplified by essentially the gain as provided in Eq. (19).

Figure 12:
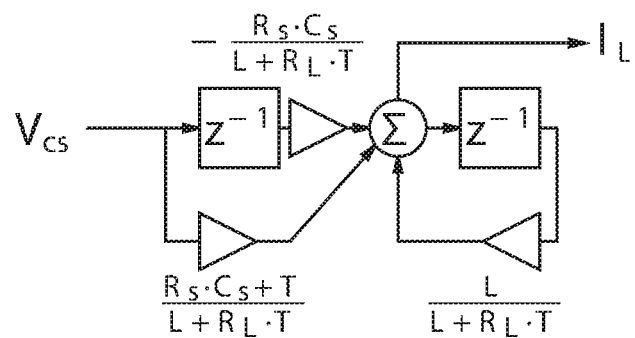
FIG. 12 shows a processing diagram for calculating inductor current from differential capacitor voltage, according to an embodiment.
Figure 13:
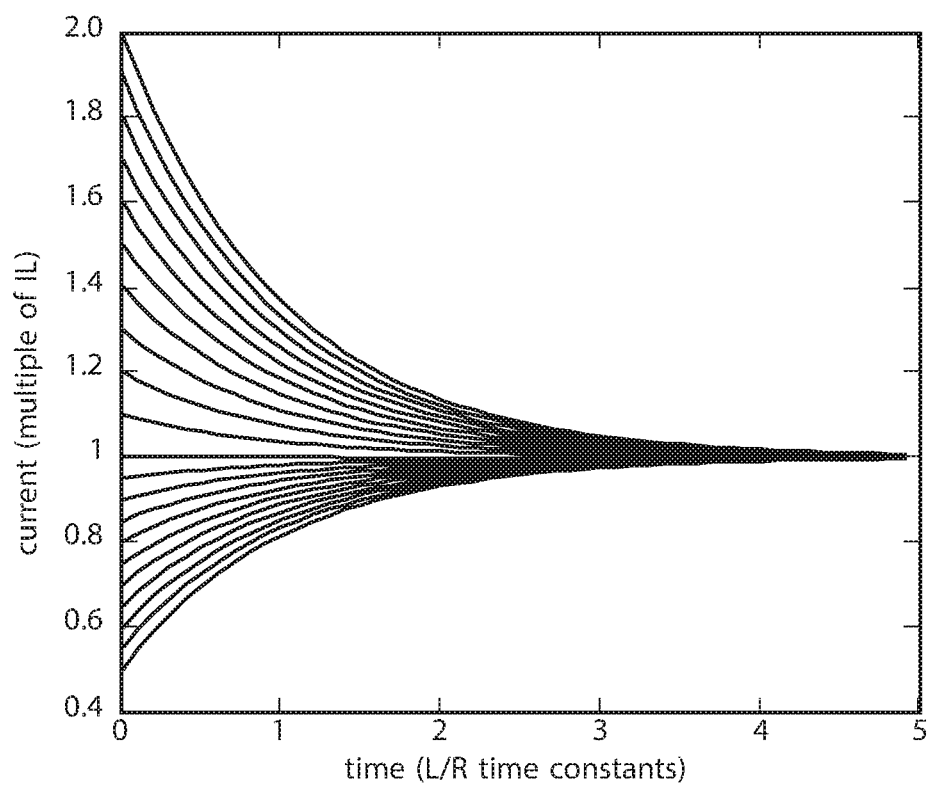
FIG. 13 shows a step response calibration, according to an embodiment.

FIG. 12 illustrates a digital signal processing filter for performing a cost-effective and comprehensive calibration. The digital signal processing filter applies a step current to the system, measuring differential capacitor voltage 29 and processing the $V_{cs}$ waveform to produce $I_L$. FIG. 13 illustrates the result of this step-response processing. The step response of the system has been determined to be:

$$\frac{1}{R_L} \cdot \left[1 + \left(\frac{R_s \cdot C_s}{\frac{R_L}{L}} - 1\right) \cdot e^{-\frac{1}{L} \cdot t}\right] \quad (3)$$

The final value of the step may be computed as the DC gain $1/R_L$. Furthermore, when normalized to a step size of unity representing $I_L$, the initial value is the ratio of the $L/R_L$ and $R_s \cdot C_s$ time constants. For example, in FIG. 12, the initial value of 0.5 times the final value of $I_L$ means that the $R_s \cdot C_s$ time-constant is one-half the size of the $L/R_L$ time-constant. Or, for example, if the initial value of $I_L$ is 2 times, the final value of $I_L$ means that the $R_s \cdot C_s$ time-constant is twice the size of the $L/R_L$ time-constant.

The time constant from initial value to final value may be computed as $L/R_L$ meaning that once the DC gain is known, and thus $R_L$ is known, the value of L may be determined by measuring the $L/R_L$ time-constant. Then, knowing L and $R_L$, the product of $R_s \cdot C_s$ may be determined. This product may be determined without the separate values of $R_s$ and $C_s$.

Thus, with such knowledge of $R_L$, L, and the product $R_s \cdot C_s$, the values of RC network resistor 27 and RC network capacitor 28 may be trimmed manually or electronically adjusted to match the initial and final values of the step response. Alternately, or in conjunction with some trimming, the final, resulting mismatch in component values can be applied to processing as provided in FIG. 12.

The calibration and measurement of RC network resistor 27 and RC network capacitor 28 values or the $R_s \cdot C_s$ time constant may be performed at the factory during construction of RC filter 2 and written into a non-volatile data storage element and read out upon connection to an existing probe tip, or upon connection of the probe to a measurement instrument. It can also be known with sufficient accuracy from manufacturer specifications and tolerances.

The preceding discussion treated the calibration as a process of determining component values, but sometimes models describing systems through lumped or finite numbers of known components or parameters is insufficient. In cases like this, if more accuracy is desired, the calibration can be performed through frequency sweeps or step response measurements including more effects, such as skin-effect resistive inductor losses that are frequency dependent, or through complete behavioral models. In these cases, the processing shown in FIG. 12 is replaced with an arbitrary filter, or processing possibly entailing the handling of nonlinearities.

Figure 10:
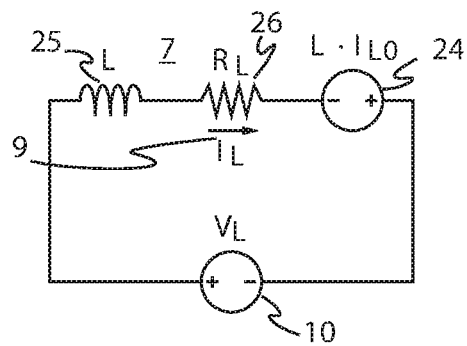
FIG. 10 is a simplified schematic for understanding inductor current, according to an embodiment.

FIG. 10 is a simplified schematic for understanding inductor current. The swing in inductor current may be determined by applying Kirchoff's voltage law (KVL) around the loop to calculate the step response. Summing the voltages around the loop, including inductor voltage 10, voltage across the actual inductance 25 of the inductor, voltage across the inductor parasitic resistance 26 of inductor 7, and voltage due to initial inductor current 24, the following may be derived:

$$-\frac{V_L}{s} + I_L \cdot R_L + I_L \cdot S \cdot L - L \cdot I_{L0} = 0 \quad (4)$$

Solving for inductor current 9, the following equation is obtained:

$$I_L(s) = \frac{\frac{V_L}{s} + L + I_{L0}}{s \cdot L + R_L} \quad (5)$$

Taking the inverse-Laplace transform of Eq. (5) to convert to the time-domain, the following equation is obtained:

$$I_L(t) = \mathcal{L}^{-1}\left(\frac{\frac{V_L}{s} + L \cdot I_{L0}}{s \cdot L + R_L}\right) = \frac{V_L}{R_L} \cdot \left(1 - e^{-\frac{R_L}{L} \cdot t}\right) + I_{L0} \cdot e^{-\frac{R_L}{L} \cdot t} \quad (6)$$

Some approximations can be made in Eq. (6). One is to use the approximation that for $\frac{R_L}{L} \cdot t$ small, a value of $e^{-x} \approx 1-x$ for small x may be used. Thus, the following equation is obtained:

$$I_L(t) \approx I_{L0} + \frac{1}{L} \cdot (V_L - R_L \cdot I_{L0}) \cdot t \quad (7)$$

Another approximation can be made in Eq. (6) by assuming $R_L=0$. As a result, the following equation is obtained:

$$\lim_{R_L \to 0} [I_L(t)] = \frac{V_L}{L} \cdot t + I_{L0} \quad (8)$$

In the current context, the inductor voltage 10 switches between an on-time voltage and an off-time voltage.

Eqs. (6), (7), and (8) imply that a portion of the cycle starts with an initial inductor current $I_{L0}$ and the inductor current changes mostly linearly with a slope $V_L/L$ until the voltage across the inductor $V_L$ is switched. In steady state, the duty cycle D in buck converters (in fraction of switching period $T_{sw}$) is the ratio of the output voltage $V_{out}$ to the input voltage $V_{in}$. During the time in the cycle where $t \leq D \cdot T_{sw}$, the voltage across the inductor is $V_L = V_{in} - V_{out}$. During the time in the cycle where $t > D \cdot T_{sw}$, the voltage across the inductor is $V_L = -V_{out}$. Therefore, the amount that the inductor current swings during the on- and off-time is:

$$I_{Lswing} = \ldots \ldots = [I_L(t) - I_{L0}] = \quad (9)$$
$$\ldots \ldots = \frac{V_L}{R_L} \cdot \left(1 - e^{-\frac{R_L}{L} \cdot t}\right) - I_{L0} \cdot \left(1 - e^{-\frac{R_L}{L} \cdot t}\right) \approx \ldots \ldots \approx \frac{V_L}{L} \cdot t$$

During the on-time, the inductor current may be approximated as follows:

$$I_{Lswing-on} \approx \frac{V_{in} - V_{out}}{L} \cdot \frac{V_{out}}{V_{in}} \cdot T_{sw} \quad (10)$$

During the off-time, the inductor current may be approximated as follows:

$$I_{Lswing-off} \approx -\frac{V_{out}}{L} \cdot \left(1 - \frac{V_{out}}{V_{in}}\right) \cdot T_{sw} \quad (11)$$

As a result, the following equation may be obtained:

$$I_{Lswing-on} + I_{Lswing-off} = 0 \quad (12)$$

Thus, the inductor current consists of a DC component $I_{LDC}$ which approximately equals the DC load current and a sawtooth waveform with duty cycle $D = V_{out}/V_{in}$, a period $T_{sw}$ and a peak-peak swing of $I_{Lswing-on}$ centered about $I_{LDC}$.

Because $I_{LDC}$ develops a voltage across the inductor of only $I_{LDC} \cdot R_L$ and $R_L$ is very small for efficient converters, it may be advantageous to have some gain in the system.

Figure 11:
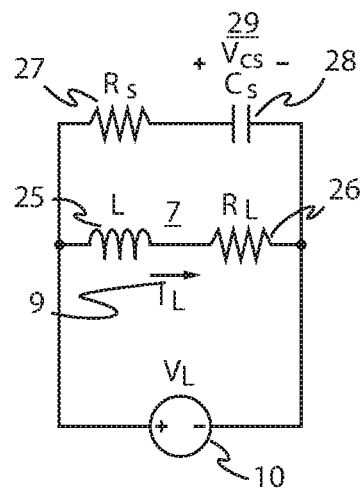
FIG. 11 is a simplified schematic providing for deriving a transfer function for inductor current measurement, according to an embodiment.

FIG. 11 illustrates the equivalent circuit relating to the measurement of inductor current. Analyzing this circuit, inductor current and the voltage across $C_s$ may be computed, respectively, as follows:

$$I_L = \frac{V_L}{s \cdot L + R_L} = \frac{\frac{V_L}{L}}{s + \frac{R_L}{L}} \quad (13)$$

$$V_{cs} = \frac{V_L}{R_s + \frac{1}{C_s \cdot s}} \cdot \frac{1}{C_s \cdot s} = \frac{\frac{V_L}{R_s \cdot C_s}}{s + \frac{1}{R_s \cdot C_s}} \quad (14)$$

Therefore, the inductor current relative to the voltage across $C_s$ is:

$$H(s) = \frac{I_L(s)}{V_{cs}(s)} = \frac{s + \frac{1}{R_s \cdot C_s}}{s + \frac{R_L}{L}} \cdot \frac{R_s \cdot C_s}{L} \quad (15)$$

At very low frequency, the transfer function is:

$$G_{DS} = \lim_{s \to 0} H(s) = \frac{1}{R_L} \quad (16)$$

This constant gain is valid for any frequency well below the two knee frequencies given as:

$$f_{pole} = \frac{R_L}{2\pi \cdot L} \quad (17)$$

and:

$$f_{zero} = \frac{1}{2\pi \cdot R_s \cdot C_s} \quad (18)$$

although, in practice, these frequencies tend to be fairly low, in the hundreds of Hz range. Thus, as pointed out earlier, knowledge of $R_L$ is useful for setting the DC gain, and might be adequate in applications involving only low-frequency or DC accuracy.

At high frequency, the transfer function is:

$$G_{HF} = \lim_{s \to 0} H(s) = \frac{R_s \cdot C_s}{L} = \frac{R_s \cdot C_s}{\frac{L}{R_L}} \cdot G_{DC} \quad (19)$$

In other words, the high-frequency gain of the system is equal to the DC gain scaled by the mismatch between the $R_s \cdot C_s$ and the $L/R_L$ time constants.

If values of $R_s$ and $C_s$ are chosen such that $R_s \cdot C_s = L/R_L$, then $H(s) = 1/R_L$ and is therefore constant with frequency. There are ways of dealing with mismatching component values and even offering precise calibration for test and measurement applications by making further analysis based on the fact that in a digital storage oscilloscope (DSO), sampled time-domain waveform representing the sampled and digitized voltage from the probe are accessible.

In sampled systems, an approximation of the derivative that allows conversion from the Laplace transform to the z transform can be used, for example:

$$s \approx \frac{1}{T} \cdot (1 - z^{-1}) \quad (20)$$

and obtain:

$$H(z) = \frac{I_L(z)}{V_{cs}(z)} = \frac{\frac{R_s \cdot C_s + T}{L + R_L \cdot T} - \frac{R_s \cdot C_s}{L + R_L \cdot T} \cdot z^{-1}}{1 - \frac{L}{L + R_L \cdot T} \cdot z^{-1}} \quad (21)$$

which allows us to write the difference equation:

$$I_{L[k]} = I_{L[k-1]} \cdot \frac{L}{L + R_L \cdot T} + V_{cs[k]} \cdot \frac{R_s \cdot C_s + T}{L + R_L \cdot T} - V_{cs[k-1]} \cdot \frac{R_s \cdot C_s}{L + R_L \cdot T} \quad (22)$$

This difference equation is shown as a processing block diagram in FIG. 12.

Other conversions from the s domain to the z domain are possible including the bilinear transformation, matched z transform, etc.

In utilizing this as an infinite impulse response (IIR) filter for processing, the time for this filter to settle may be estimated. To do this, a good guess is made at the form of the step response as:

$$S_{[k]} = A + B \cdot (1 - e^{-kC}) \quad (23)$$

When k=0, $S_{[0]}$=A and that A is the high frequency gain of the system. Using the impulse response initial and final value theorem as $$f(0) = \lim_{s \to \infty} s \cdot F(s) \text{ and } f(\infty) = \lim_{s \to 0} s \cdot F(s),$$

and computing the initial and final value of the step response which involves first dividing by s:

$$A = \lim_{s \to \infty} H(s) = \frac{R_s \cdot C_s}{L} \quad (24)$$

As k→∞ the low frequency gain of the system should be obtained:

$$A + B = \lim_{s \to \infty} H(s) = \frac{1}{R_L} \quad (25)$$

and thus:

$$B = \frac{1}{R_L} - \frac{R_s \cdot C_s}{L} \quad (26)$$

To obtain the constant C, solve for the second point calculated $I_{I[1]}$:

$$I_{L[1]} = \frac{R_s \cdot C_s}{L} + \left(\frac{1}{R_L} - \frac{R_s \cdot C_s}{L}\right) \cdot (1 - e^C) = \quad (27)$$

$$\frac{R_s \cdot C_s}{L} \cdot \frac{L}{L + R_L \cdot T} + \frac{T}{L + R_L \cdot T}$$

and obtain:

$$C = \ln\left(\frac{L}{L + R_L \cdot T}\right) = \ln\left(1 - \frac{R_L \cdot T}{L + R_L \cdot T}\right) \quad (28)$$

and since the amount added to one is very small generally, the time constant can be approximated as:

$$\tau \approx \frac{(L + R_L \cdot T)}{R_L} S \approx \frac{L}{R_L} S = \frac{L}{R_L \cdot T} \text{samples} \quad (29)$$

Five time-constants are generally used, but this could be economized if desired. Instead of asking the filter to settle to 99% of the final value, enough time is allowed for the high- and low-frequency gains to match. In other words, the settling time allowed can be raised or lowered depending on the magnitude of the difference between the high- and low-frequency gains encapsulated in the magnitude of $1/R_L - R_s \cdot C_s/L$.

Figure 14:
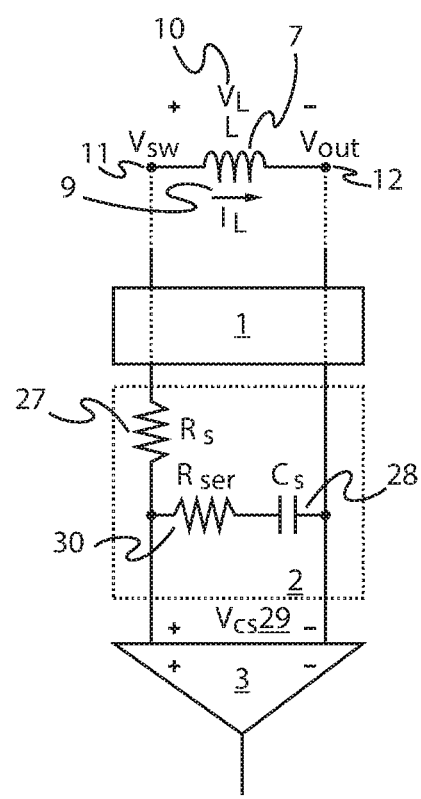
FIG. 14 is a block diagram of an inductor current measurement probe with a series resistor.

In one or more embodiments, it may be preferable to add, to the configuration illustrated in FIG. 1, a series resistor. For example, FIG. 14 is a block diagram of an inductor current measurement probe with series resistor 30, denoted $R_{ser}$. This arrangement has several advantages including the amplification of the differential mode component of the signal seen by the differential probe.

In one or more embodiments, series resistor 30 may represent a series resistance of a capacitor, for example by using a high ESR capacitor available from many capacitor vendors.

With reference to FIG. 14, the inductor current, $I_L$, may be computed as provided in Eq. (13) above. However, the voltage across the combination of $R_{ser}$ and $C_s$ becomes:

$$V_{cs} = \frac{V_L \cdot \left(\frac{1}{C_s \cdot s} + R_{ser}\right)}{R_s + \frac{1}{C_s \cdot s} + R_{ser}} = \frac{V_L \cdot R_{ser}}{R_s + R_{ser}} \cdot \frac{s + \frac{1}{C_s \cdot R_{ser}}}{s + \frac{1}{C_s \cdot (R_s + R_{ser})}} \quad (30)$$

Therefore, the inductor current relative to the voltage across the combination of $R_{ser}$ and $C_s$ is:

$$H(s) = \frac{I_L(s)}{V_{cs}(s)} = \frac{V_L}{L} \cdot \frac{1}{s + \frac{R_L}{L}} \cdot \frac{R_s + R_{ser}}{V_L \cdot R_{ser}} \cdot \frac{s + \frac{1}{C_s \cdot (R_s + R_{ser})}}{s + \frac{1}{C_s \cdot R_{ser}}} = \quad (31)$$

$$\ldots \ldots = \frac{R_s + R_{ser}}{L \cdot R_{ser}} \cdot \frac{s + \frac{1}{C_s \cdot (R_s + R_{ser})}}{\left(s + \frac{R_L}{L}\right) \cdot \left(s + \frac{1}{C_s \cdot R_{ser}}\right)}$$

At very low frequency, the transfer function is:

$$G_{DC} = \lim_{s \to \infty} H(s) = \frac{1}{R_L} \quad (32)$$

There are two poles in this transfer function at:

$$f_{pole1} = \frac{R_L}{2\pi \cdot L} \quad (33)$$

and:

$$f_{pole2} = \frac{1}{2\pi \cdot C_s \cdot R_{ser}} \quad (34)$$

and a zero at $$f_{zero} = \frac{1}{2\pi \cdot C_s \cdot (R_s + R_{ser})} \quad (35)$$

Based on the preceding discussion, it can be shown that the z-domain transfer function may be represented as:

$$D = \frac{1}{T \cdot R_{ser} \cdot C_s} + \frac{R_L}{L \cdot T} + \frac{1}{T^2} + \frac{R_L}{L \cdot R_{ser} \cdot C_s} \quad (36)$$

$$b_1 = -\frac{1}{D} \cdot \left( \frac{2}{T^2} + \frac{R_L}{L \cdot T} + \frac{1}{T^2 \cdot R_{ser} \cdot C_s} \right)$$

$$b_2 = \frac{1}{D} \cdot \frac{1}{T^2}$$

$$M = \frac{R_s + R_{ser}}{R_{ser} \cdot L}$$

$$a_0 = \frac{M}{D} \cdot \left( \frac{1}{T} + \frac{1}{C_s \cdot (R_s + R_{ser})} \right)$$

$$a_1 = -\frac{M}{D} \cdot \frac{1}{T}$$

$$a_2 = 0$$

This forms the definition of a digital bisquad section as follows:

$$H(z) = \frac{a_0 + a_1 \cdot z^{-1} + a_2 \cdot z^{-2}}{b_0 + b_1 \cdot z^{-1} + b_2 \cdot z^{-2}} \quad (37)$$

The digital bisquad section (13) may be converted to an IIR filter or other alternate forms for processing of the measured voltage waveform to convert this waveform to calculated inductor current.

4. Signal Processing Hardware

One or more embodiments described above may be performed by a signal processing element. A signal processing element may include one or more digital and/or analog hardware processors. Example processors include, but are not limited to waveform processors, such as those included in digital oscilloscopes, arithmetic logic units (ALUs), central processing units (CPU), and microprocessors. Additionally or alternatively, the techniques described herein are implemented by one or more special-purpose computing devices. The special-purpose computing devices may be hard-wired to perform the techniques, or may include digital electronic devices such as one or more application-specific integrated circuits (ASICs), field programmable gate arrays (FPGAs), or network processing units (NPUs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, FPGAs, or NPUs with custom programming to accomplish the techniques. The special-purpose computing devices may be desktop computer systems, portable computer systems, handheld devices, networking devices or any other device that incorporates hard-wired and/or program logic to implement the techniques.

Figure 15:
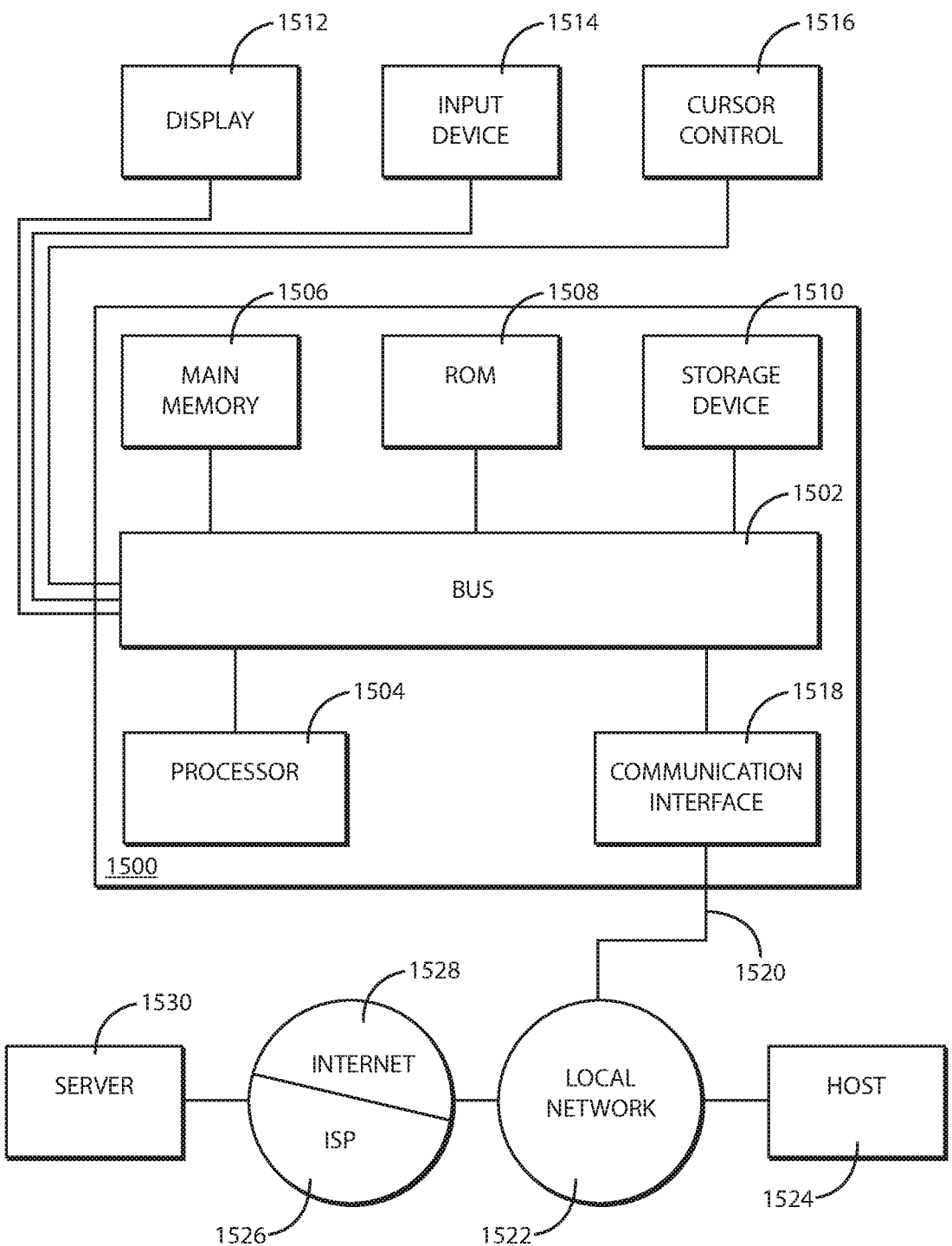
FIG. 15 is a block diagram of a computing system on which one or more signal processing functions may be implemented.

For example, FIG. 15 is a block diagram that illustrates a computer system 1500 upon which an embodiment of the invention may be implemented. Computer system 1500 includes a bus 1502 or other communication mechanism for communicating information, and a hardware processor 1504 coupled with bus 1502 for processing information. Hardware processor 1504 may be, for example, a general purpose microprocessor.

Computer system 1500 also includes a main memory 1506, such as a random access memory (RAM) or other dynamic storage device, coupled to bus 1502 for storing information and instructions to be executed by processor 1504. Main memory 1506 also may be used for storing temporary variables or other intermediate information during execution of instructions to be executed by processor 1504. Such instructions, when stored in non-transitory storage media accessible to processor 1504, render computer system 1500 into a special-purpose machine that is customized to perform the operations specified in the instructions.

Computer system 1500 further includes a read only memory (ROM) 1508 or other static storage device coupled to bus 1502 for storing static information and instructions for processor 1504. A storage device 1510, such as a magnetic disk or optical disk, is provided and coupled to bus 1502 for storing information and instructions.

Computer system 1500 may be coupled via bus 1502 to a display 1512, such as a cathode ray tube (CRT), for displaying information to a computer user. An input device 1514, including alphanumeric and other keys, is coupled to bus 1502 for communicating information and command selections to processor 1504. Another type of user input device is cursor control 1516, such as a mouse, a trackball, or cursor direction keys for communicating direction information and command selections to processor 1504 and for controlling cursor movement on display 1512. This input device typically has two degrees of freedom in two axes, a first axis (e.g., x) and a second axis (e.g., y), that allows the device to specify positions in a plane.

Computer system 1500 may implement the techniques described herein using customized hard-wired logic, one or more ASICs or FPGAs, firmware and/or program logic which in combination with the computer system causes or programs computer system 1500 to be a special-purpose machine. According to one embodiment, the techniques herein are performed by computer system 1500 in response to processor 1504 executing one or more sequences of one or more instructions contained in main memory 1506. Such instructions may be read into main memory 1506 from another storage medium, such as storage device 1510. Execution of the sequences of instructions contained in main memory 1506 causes processor 1504 to perform the process steps described herein. In alternative embodiments, hardwired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 1510. Volatile media includes dynamic memory, such as main memory 1506. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, content-addressable memory (CAM), and ternary content-addressable memory (TCAM).

Storage media is distinct from but may be used in conjunction with transmission media. Transmission media participates in transferring information between storage media. For example, transmission media includes coaxial cables, copper wire and fiber optics, including the wires that comprise bus 1502. Transmission media can also take the form of acoustic or light waves, such as those generated during radio-wave and infra-red data communications.

Various forms of media may be involved in carrying one or more sequences of one or more instructions to processor 1504 for execution. For example, the instructions may initially be carried on a magnetic disk or solid state drive of a remote computer. The remote computer can load the instructions into its dynamic memory and send the instructions over a telephone line using a modem. A modem local to computer system 1500 can receive the data on the telephone line and use an infra-red transmitter to convert the data to an infra-red signal. An infra-red detector can receive the data carried in the infra-red signal and appropriate circuitry can place the data on bus 1502. Bus 1502 carries the data to main memory 1506, from which processor 1504 retrieves and executes the instructions. The instructions received by main memory 1506 may optionally be stored on storage device 1510 either before or after execution by processor 1504.

Computer system 1500 also includes a communication interface 1518 coupled to bus 1502. Communication interface 1518 provides a two-way data communication coupling to a network link 1520 that is connected to a local network 1522. For example, communication interface 1518 may be an integrated services digital network (ISDN) card, cable modem, satellite modem, or a modem to provide a data communication connection to a corresponding type of telephone line. As another example, communication interface 1518 may be a local area network (LAN) card to provide a data communication connection to a compatible LAN. Wireless links may also be implemented. In any such implementation, communication interface 1518 sends and receives electrical, electromagnetic or optical signals that carry digital data streams representing various types of information.

Network link 1520 typically provides data communication through one or more networks to other data devices. For example, network link 1520 may provide a connection through local network 1522 to a host computer 1524 or to data equipment operated by an Internet Service Provider (ISP) 1526. ISP 1526 in turn provides data communication services through the world wide packet data communication network now commonly referred to as the "Internet" 1528.

Local network 1522 and Internet 1528 both use electrical, electromagnetic or optical signals that carry digital data streams. The signals through the various networks and the signals on network link 1520 and through communication interface 1518, which carry the digital data to and from computer system 1500, are example forms of transmission media.

Computer system 1500 can send messages and receive data, including program code, through the network(s), network link 1520 and communication interface 1518. In the Internet example, a server 1530 might transmit a requested code for an application program through Internet 1528, ISP 1526, local network 1522 and communication interface 1518.

The received code may be executed by processor 1504 as it is received, and/or stored in storage device 1510, or other non-volatile storage for later execution.

5. Miscellaneous; Extensions

Embodiments are directed to a system with one or more devices that include a hardware processor and that are configured to perform any of the operations described herein and/or recited in any of the claims below.

Any combination of the features and functionalities described herein may be used in accordance with one or more embodiments. In the foregoing specification, embodiments have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A system for measuring at least one parameter related to an inductor, the system comprising:
    a probe interconnect including a first connection that connects to a first terminal of the inductor and a second connection that connects to a second terminal of the inductor;
    an RC filter that is connected to the probe interconnect and that includes at least one RC network resistor and at least one RC network capacitor in an arrangement that converts a voltage across the inductor to a differential capacitor voltage;
    differential probe input circuitry including a first terminal and a second terminal that are connected to the RC filter and arranged to convert the differential capacitor voltage to a single-ended voltage, wherein the single-ended voltage is indicative of the at least one parameter related to the inductor;
    a compensation resistor; and
    a compensation capacitor included across the compensation resistor.

2. The system of claim 1, wherein the at least one parameter includes a current flowing in the inductor.

3. The system of claim 1, further comprising a waveform processor.

4. The system of claim 3, wherein the waveform processor is included in a digital storage oscilloscope.

5. The system of claim 1, wherein a parallel combination of the compensation resistor and the compensation capacitor are placed between the at least one RC network capacitor and the differential probe input circuitry.

6. The system of claim 1, further comprising a ground wire for connecting between a measurement reference ground and a device under test (DUT) reference ground.

7. The system of claim 6, wherein the DUT reference ground is not connected to earth ground.

8. The system of claim 1, wherein the voltage across the inductor is a voltage between a switch node and a non-switched node.

9. The system of claim 8, wherein the at least one RC network resistor is connected directly to the switch node.

10. The system of claim 1, further comprising a series resistor connected to the at least one RC network capacitor.

11. The system of claim 10, further comprising a signal processing element that converts the single-ended voltage to the at least one parameter.

12. The system of claim 10, wherein the series resistor is incorporated or inherent within the at least one RC network capacitor.

13. A method comprising for measuring at least one parameter related to an inductor, the method comprising:
    measuring, by a probe interconnector that includes a first connection to a first terminal of the inductor and a second connection to a second terminal of the inductor, a voltage across the inductor;
    converting, by an RC filter that includes at least one RC network resistor and at least one RC network capacitor, the voltage across the inductor to a differential capacitor voltage;
    wherein the RC filter further includes at least one compensation resistor and at least one compensation capacitor added across the compensation resistor; and
    converting the differential capacitor voltage to a single-ended voltage that is indicative of the at least one parameter related to the inductor.

14. The method of claim 13, wherein the at least one parameter includes a current flowing in the inductor, the method further comprising converting the single-ended voltage to the current flowing in the inductor.

15. The method of claim 13, further comprising generating and outputting, based on the single-ended voltage, a waveform that represents current flowing in the inductor.

16. The method of claim 13, further comprising connecting a ground wire between a measurement reference ground and a device under test (DUT) reference ground.

17. The method of claim 13, wherein a parallel combination of the at least one compensation resistor and the at least one compensation capacitor are placed between the at least one RC network capacitor and the differential probe input circuitry.

18. The method of claim 13, further comprising connecting a ground wire between a measurement reference ground and a device under test (DUT).

19. The method of claim 18, wherein the DUT reference ground is not connected to earth ground.

20. The method of claim 13, wherein the voltage across the inductor is a voltage between a switch node and a non-switched node.

* * * * *

UNITED STATES PATENT AND TRADEMARK OFFICE
CERTIFICATE OF CORRECTION

PATENT NO. : 10,551,417 B2
APPLICATION NO. : 15/803309
DATED : February 4, 2020
INVENTOR(S) : Novak et al.

It is certified that error appears in the above-identified patent and that said Letters Patent is hereby corrected as shown below:

In the Specification

In Column 10, Line 36, delete "Kirchoff s" and insert -- Kirchhoff's --, therefor.

In Column 12, Lines 46-52, delete " $G_{HF} = \lim_{s \to 0} H(s) = \frac{R_s \cdot C_s}{L} = \frac{R_s \cdot C_s}{\frac{L}{R_L}} \cdot G_{DC}$ " and insert -- $G_{HF} = \lim_{s \to \infty} H(s) = \frac{R_s \cdot C_s}{L} = \frac{R_s \cdot C_s}{\frac{L}{R_L}} \cdot G_{DC}$ --, therefor.

In Column 15, Lines 2-6, delete " $G_{DC} = \lim_{s \to \infty} H(s) = \frac{1}{R_L}$ " and insert -- $G_{DC} = \lim_{s \to 0} H(s) = \frac{1}{R_L}$ --, therefor.

In Column 15, Line 30, Below " $D = \frac{1}{T \cdot R_{ser} \cdot C_s} + \frac{R_L}{L \cdot T} + \frac{1}{T^2} + \frac{R_L}{L \cdot R_{ser} \cdot C_s}$ " insert -- $b_0 = 1$ --.

Signed and Sealed this
Third Day of November, 2020

Andrei Iancu
*Director of the United States Patent and Trademark Office*